United States Patent [19]

Crosby

[11] 4,316,150
[45] Feb. 16, 1982

[54] PHASE LOCKED LOOP INCLUDING PHASE DETECTOR SYSTEM CONTROLLED BY ENABLE PULSES

[75] Inventor: Philip S. Crosby, Portland, Oreg.

[73] Assignee: Tektronix, Inc., Beaverton, Oreg.

[21] Appl. No.: 110,561

[22] Filed: Jan. 9, 1980

[51] Int. Cl.³ .......................... H03L 7/08; H03K 5/26
[52] U.S. Cl. ..................................... 331/1 A; 307/511; 328/133; 331/8; 331/14; 331/17; 331/27
[58] Field of Search ....................... 331/1 A, 14, 17, 8, 331/25, 27; 307/232; 328/133, 134, 155

[56] References Cited

U.S. PATENT DOCUMENTS 3,813,604  5/1974  Denoncourt ..................... 328/133 X
4,080,576  3/1978  Huber et al. ..................... 328/134 X
4,222,013  9/1980  Bowers et al. ..................... 331/27 X
4,244,043  1/1981  Fujita et al. ....................... 331/25 X Primary Examiner—Siegfried H. Grimm

[57] ABSTRACT

A second-order phase-locked loop circuit which does not require error voltage amplification is described. The output of a voltage controlled oscillator is accurately phase locked to a reference pulse. The loop phase detector is periodically enabled by a pulse generator and draws current only when enabled. Therefore very little noise may be coupled to the voltage controlled oscillator. The phase detector incorporates a current amplifier which allows very accurate establishment of the instant phase comparison takes place.

7 Claims, 3 Drawing Figures

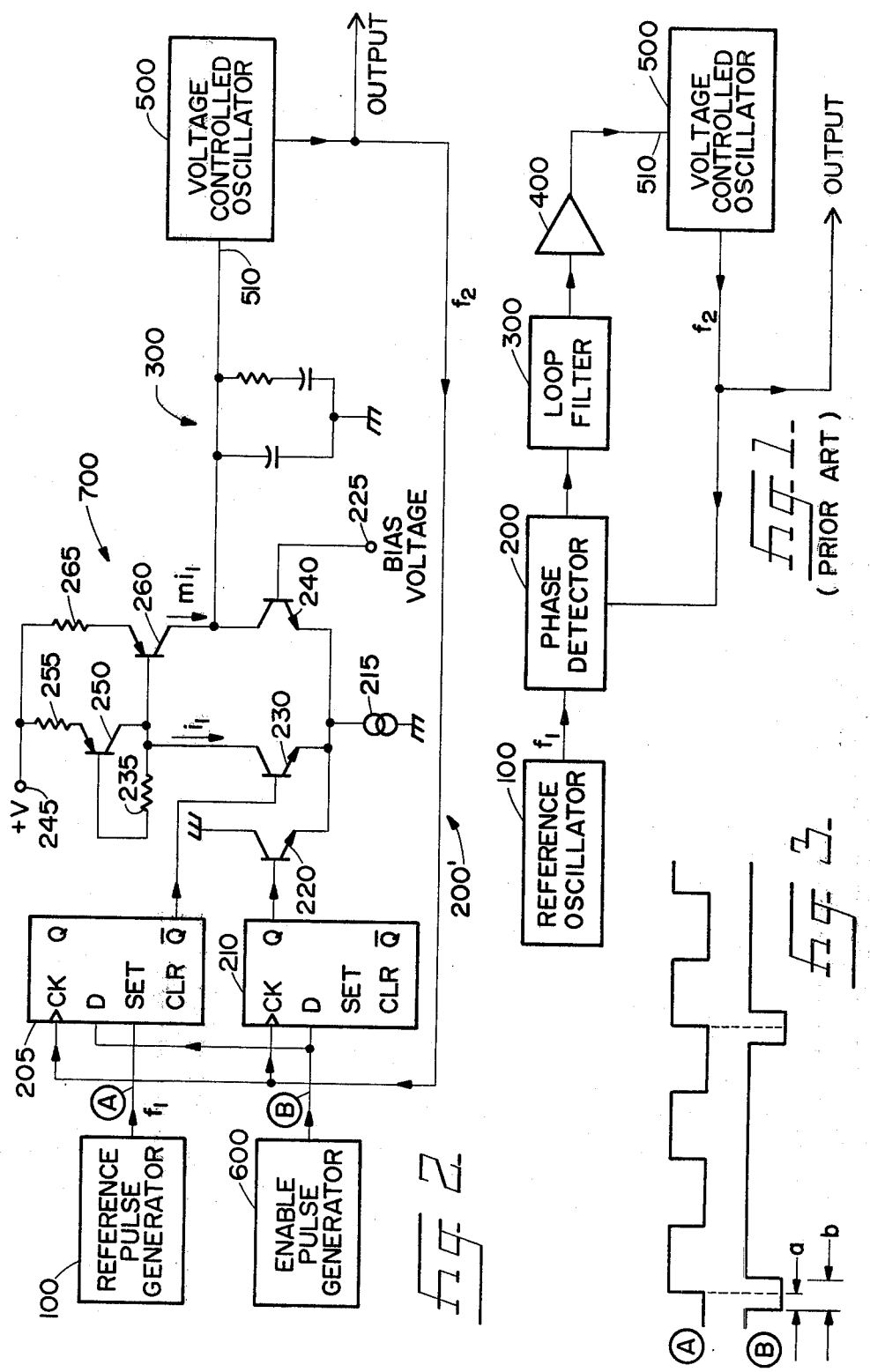

PHASE LOCKED LOOP INCLUDING PHASE DETECTOR SYSTEM CONTROLLED BY ENABLE PULSES

BACKGROUND OF THE INVENTION

The present invention relates to phase-locked loop systems and more specifically to apparatus for detecting phase errors and generating a phase error correction voltage.

There is a continual need for circuit arrangements which provide a second signal in accurately timed relation with a first signal. Phase-locked loops are commonly used to accomplish this end. In a phase-locked loop, the two signals are applied to a phase detector, the output of which is a function of the phase difference between the two signals applied. An error voltage is developed which, after low-pass filtering in a loop filter, is applied to the control input of a voltage controlled oscillator in such a way that the oscillator signal phase must follow the input signal phase. In most second-order phase-locked loops, an error amplifier has to be fitted between the phase detector and the voltage-controlled oscillator.

Those desiring detailed information on the subject of phase-locked loop circuits are referred to Chapter 6 of the text *Frequency Synthesis* by V. F. Kroupa, Copyright 1973, Charles Griffin & Company Limited.

SUMMARY OF THE INVENTION

According to the present invention, the output of a voltage controlled oscillator is accurately phase locked to a reference pulse. The phase detector utilized in the present invention draws current only during the duration of an enabling pulse, thereby reducing the possibility of coupling noise to the control terminal of the voltage-controlled oscillator. The construction of the phase detector eliminates the requirement for an error signal amplifier; thus removing another possible source of noise. Furthermore, the point in time at which phase detection takes place is accurately established by a current mirror. The current mirror circuit is used to direct current into and out of the loop filter.

It is therefore an object of the present invention to provide a phase-locked loop circuit in which an amplifier is not required between the phase detector and the loop filter.

It is another object of the present invention to provide a phase detector for a phase-locked loop whose error signal output does not require amplification.

It is a further object of the present invention to provide a phase detector in which the point of detection may be accurately established.

It is yet another object of the present invention to provide a phase detector in which the point of detection may easily be changed.

BRIEF DESCRIPTION OF THE DRAWINGS

Various features and advantages of the present invention will become apparent upon consideration of the following description, taken in conjunction with the accompanying drawings wherein:

FIG. 1 is a block diagram of a prior art phase-locked loop circuit useful for explaining the advantages of the present invention;

FIG. 2 is a combination block diagram and schematic of a system according to the present invention; and FIG. 3 comprises various signal waveforms helpful in explaining the circuit of FIG. 2.

DETAILED DESCRIPTION OF THE PREFERRED EMBODIMENT

Even though the operation of phase-locked loops is known to those skilled in the art, the present invention may be best understood by referring to FIG. 1 which is a block diagram of a prior art system.

In FIG. 1, a reference oscillator 100 provides a signal at a frequency $f_1$. It is desired to provide a second signal $f_2$ in accurately timed relation with the first signal. The signal at $f_2$ is produced in a controlled frequency signal generator means or oscillator 500, such oscillator having a high impedance control input 510. Oscillator 500 may be a crystal oscillator which is voltage controllable.

The output of oscillator 500 is applied to means for comparing the phase of the first signal at frequency $f_1$ with the second signal at $f_2$. The latter means suitably comprises a phase detector 200. If the signals at $f_1$ and $f_2$ are in desired phase relation, phase detector 200 produces no error signal. However, should the two be other than in desired phase relationship, phase detector 200 provides an error signal control voltage to the control input 510 of oscillator 500 for changing the frequency $f_2$ in a direction for maintaining accurate phase relation between the signals at frequencies $f_1$ and $f_2$.

Loop filter 300 and amplifier 400 are operably disposed in the path of the previously mentioned error signal control voltage. The transfer function of loop filter 300 has considerable effect on loop stability. The task of loop filter 300 is to attenuate fast changes in phase error due to noise in the signal at frequency $f_1$; it also helps to smooth out the high-frequency components of the phase detector output. Amplifier 400 is fitted between the loop filter 300 and control input 510 of oscillator 500 to produce the required loop gain. Alternatively, the passive components of loop filter 300 may be used in a feedback network of a high-gain amplifier to provide an active filter (not shown). The use of a loop filter produces the type of phase-locked loop known as a second-order loop.

Referring now to FIG. 2, therein is illustrated a preferred embodiment of the present invention. FIG. 3 shows typical waveforms at several points in the circuit of FIG. 2 and should be used in conjunction therewith while reading the following description. Reference pulse generator 100 preferably generates rectangular-shaped pulses such as those shown as waveform A in FIG. 3. Generator 100 produces the rectangular-shaped pulses at frequency $f_1$ and may be any conventional generator.

Enable pulse generator 600 generates pulses similar to those shown as waveform B in FIG. 3. Both the reference pulses and the enable pulses are applied to phase detector 200'.

Phase detector 200' comprises D-type flip-flops 205 and 210; switching transistors 220, 230, and 240; constant current source 215; and an inverting current amplifier 700. Flip-flops 205 and 210 are conventional negative edge-triggered devices. The reference pulse is applied to the SET input of flip-flop 205 while the enable pulse is applied to the D input of both flip-flop 205 and flip-flop 210. The Q output of flip-flop 205 and the $\overline{Q}$ output of flip-flop 210 are not used, while the $\overline{Q}$ output of flip-flop 205 is connected to the base of transistor 230 and the Q output of flip-flop 210 is connected to the base of transistor 220.

The emitters of transistors 220, 230, and 240 are coupled together at one terminal of conventional current source 215. The other terminal of current source 215 is connected to ground. The collector of transistor 220 is also connected to ground. The collector of transistor 230 is connected to the input of current amplifier 700 and the collector of transistor 240 is connected to the output of current amplifier 700. The base of transistor 240 is connected to a source of suitable bias voltage 225.

Current amplifier 700 comprises PNP transistors 250 and 260; and resistors 235, 255, and 265. Transistors 250 and 260 have their emitters connected to a source of potential (shown as positive source 245 for purposes of explanation only) via resistors 255 and 265, respectively. The base of transistor 250 is connected via series resistor 235 to the collector of the same and as such is commonly referred to as being diode connected and operated. The diode-connected transistor 250 therefore provides the bias voltage for a current source transistor 260 in that the collector of transistor 250 is also directly connected to the base of transistor 260. The above-described circuit is fully disclosed in U.S. Pat. No. 3,939,434, Wideband DC Current Amplifier, issued Feb. 17, 1976, which is herein incorporated by reference.

The output of phase detector 200' is taken at the junction of the collector of transistor 260 and the collector of transistor 240. This error signal is coupled to conventional loop filter 300 which performs as previously described. The filtered error signal is then applied to control input 510 of voltage controlled oscillator 500. Control input 510 is preferably connected to one terminal of a variable capacitance diode used to alter the frequency of oscillator 500. The output of voltage-controlled oscillator 500 is the desired signal at frequency $f_2$. In addition to serving as the output signal, the signal at $f_2$ is also fed back to phase detector 200'. More specifically, it is returned to the CK (clock) input terminal of both flip-flop 205 and flip-flop 210.

The overall purpose of the above-described circuit is essentially the same as the prior art circuit of FIG. 1. A second signal at frequency $f_2$ is provided in accurately timed relation with a first signal at frequency $f_1$. However, the present invention departs from the prior art by providing the above-described novel phase detector 200', the operation of which is described below.

The phase detector is activated by the receipt of a negative-going enable pulse at the D input of flip-flop 210. Therefore, the Q output of flip-flop 210 will be clocked negative by the next clock pulse received at its CK input. The enable pulse is also connected to the D input of flip-flop 205. Since flip-flop 205 receives the same clock pulses as flip-flop 210, when the Q output of flip-flop 210 goes low, the $\overline{Q}$ output of flip-flop 205 goes high placing a positive voltage at the base of transistor 230. This biases transistor 230 into conduction allowing current $i_1$ to flow through transistor 230. Current $mi_1$ is produced in the collector of transistor 260 (via current mirror action). The letter m represents the gain of the current mirror amplifier 700 and is equal to the ratio of the value of resistor 255 to the value of resistor 265. This current flow causes a charge to be built up across loop filter 300. The charge builds across loop filter 300 until the occurrence of the positive-going edge of the reference pulse. The time between the beginning of the enable pulse and the beginning of the reference pulse is designated "a" in FIG. 3. Therefore the charge developed across the loop filter is:

$$Q_1 = mi_1 a \quad (1)$$

When a positive-going reference pulse arrives at the SET input of flip-flop 205, its $\overline{Q}$ output goes low after the next clock pulse. Flip-flop 210 remains unchanged. The negative voltage at the base of transistor 230 causes the current flow to cease. However, the charge across loop filter 300 will cause current to flow through the collector-to-emitter path of transistor 240 until the end of the enable pulse. In FIG. 3 the duration of the enable pulse is designated "b". Therefore, the charge absorbed from loop filter 300 is:

$$Q_2 = i_1 (b-a) \quad (2)$$

Thus, the net charge on the loop filter is:

$$Q_N = mi_1 a - i_1 (b-a) \quad (3)$$

The voltage developed across the loop filter controls the frequency of oscillator 500. Under steady-state conditions, Q=0; therefore:

$$mi_1 a = i_1 (b-a) \quad (4)$$

and $$a/b = 1/(m+1) \quad (5)$$

The point a/b is, thus, independent of all circuit parameters except m, the gain of inverting amplifier 700. It follows then that the point of detection may be varied by varying m. In the embodiment of FIG. 2, m=1 (since the value of resistor 255 was selected to be equal to the value of resistor 265) and a/b=½. Consequently, the signal at frequency $f_2$ will be locked to the center of the enable pulse which is coincident with the positive-going edge of the reference pulse.

When the positive-going edge of the enable pulse arrives at the D inputs of flip-flops 205 and 210, their outputs will change state after the next clock pulse. The Q output of flip-flop 210 will be high and the $\overline{Q}$ output of flip-flop 205 will be low. Thus, the high level signal at the base of transistor 220 will disable phase detector 200. The charge across loop filter 300 will maintain the voltage at control input 510. When the next enable pulse is received, the above-described process will repeat.

In summary, the output of voltage controlled oscillator 500 (by virtue of the fact that it is the clock input to flip-flops 205 and 210) is accurately phase locked to a reference pulse. The phase detector is only enabled and drawing current during the duration of the enable pulse. Therefore, there is very little opportunity for noise to be coupled to control input 510 of oscillator 500. Furthermore, the point in time at which the phase detection occurs is accurately established by a current mirror circuit. The current mirror circuit is used to direct current into and out of the system loop filter.

It may be observed in the foregoing specification that such specification has not been burdened by the inclusion of large amounts of detail and specific information relative to matters such as biasing and the like since such information is well within the skill of the art. It should also be noted that the particular embodiment of the invention which is shown and described herein is intended to be merely illustrative and not restrictive of the invention. Therefore, the appended claims are intended to cover all modifications to the invention which fall within the scope of the foregoing specification.

I claim as my invention:

1. A system for providing a second signal at a second frequency in accurate-timed relation with a first signal at a first frequency, comprising:

controlled signal generating means for generating the second signal;

enable pulse generating means for generating an enable pulse independent of the second signal and in fixed phase relationship with said first signal; and phase detecting means for comparing the first signal with the second signal and controlling said controlled generating means in response to the comparison for maintaining the second signal in accurate timed relation with the first signal, said phase detecting means being activated for the interval of the enable pulse from said enable pulse generating means.

2. The system according to claim 1 wherein said phase detecting means comprises:

a first flip-flop circuit having a clock input connected to the output of said controlled signal generating means, a D input connected to the output of said enable pulse generating means, a SET input connected to receive the first signal, and a $\overline{Q}$ output;

a second flip-flop circuit having a clock input connected to the output of said controlled signal generating means, a D input connected to the output of said enable pulse generating means, and a Q output;

current amplifying means for providing an error current; and switching means connected to said Q and said $\overline{Q}$ outputs and to said current amplifying means for switching said error current to said controlled signal generating means.

3. The system according to claim 1 further comprising a loop filter operably disposed between said phase detecting means and said controlled signal generating means.

4. The system according to claim 1 wherein said controlled signal generating means comprises a high input impedance voltage controlled oscillator.

5. A phase detector system for comparing the phase of a first signal at a first frequency with a second signal at a second frequency, comprising:

enable pulse generating means for generating an enable pulse;

a first flip-flop circuit having a clock input connected to receive the second signal, a D input to receive the output of said enable pulse generating means, a SET input connected to receive the first signal, and a $\overline{Q}$ output;

a second flip-flop circuit having a clock input connected to receive the second signal, a D input to receive the output of said enable pulse generating means, and a Q output;

current amplifying means for providing a switchable error current; and switching means responsive to said Q and said $\overline{Q}$ outputs for switching said error current.

6. The system according to claim 2 or 5 wherein said current amplifying means comprises a current mirror circuit.

7. The system according to claim 2 or 5 wherein said switching means comprises:

a first switching transistor having a base electrode connected to said Q output of said second flip-flop and a collector electrode connected to a reference potential;

a second switching transistor having a base electrode connected to said $\overline{Q}$ output of said first flip-flop and a collector electrode connected to said current amplifying means; and a third switching transistor having a base electrode connected to a bias potential, a collector electrode connected to said current amplifying means and an emitter electrode connected in common with the emitter electrodes of said first and second switching transistors.

* * * * *